US006846578B2

(12) United States Patent
Kumacheva et al.

(10) Patent No.: US 6,846,578 B2
(45) Date of Patent: Jan. 25, 2005

(54) METHOD OF COLLOID CRYSTAL GROWTH ON PATTERNED SURFACES

(75) Inventors: Eugenia Kumacheva, 382 Ellerslie Ave., Toronto (CA), M2R 1B9; Edward H. Sargent, 1206-400 Walmer Road, Toronto (CA), M5P 2X7; Robert Kori Golding, 45 Hallam Street, Toronto (CA), M6G 1W1; Mathieu Allard, 1804-2 Second Avenue, Toronto (CA), M4C 2C3

(73) Assignees: Eugenia Kumacheva, Tornonto (CA); Edward H. Sargent, Tornonto (CA); Robert Kori Golding, Tornonto (CA); Mathieu Allard, Tornonto (CA)

(*) Notice: Subject to any disclaimer, the term of this patent is extended or adjusted under 35 U.S.C. 154(b) by 162 days.

(21) Appl. No.: 10/353,071

(22) Filed: Jan. 29, 2003

(65) Prior Publication Data

US 2004/0144650 A1 Jul. 29, 2004

(51) Int. Cl.[7] .............................. B32B 3/00; C25D 5/02

(52) U.S. Cl. ...................... 428/612; 205/118; 205/122; 205/123; 205/157; 428/687; 428/323; 428/327; 428/332; 428/336; 428/339; 428/926; 428/935; 977/DIG. 1

(58) Field of Search ................................ 428/612, 687, 428/323, 327, 332, 336, 339, 926, 935; 205/118, 122, 123, 157; 977/DIG. 1

(56) References Cited

PUBLICATIONS

S. John, Phys. Rev. Lett. Jun. 8, 1987, vol. 58, No. 23, 2486–2489, Strong localization of photons in certain disordered dielectric superlattices.

H. Kosaka et al., Appl. Phys. Lett, Mar. 8, 1999, vol. 74, No. 10, 1370–1372, Photonic crystals for micro lightwave circuits using wavelength–dependent angular beam steering.

A. Imhof et al. Nature Oct. 30, 1997, vol. 389, 948–951 Ordered macroporous materials by emulsion templating.

B.T. Holland et al., Science Jul. 24, 1998, vol. 281, Synthesis of macroporous minerals with highly ordered three–dimensional arrays of spheroidal voids.

A. A. Zahidov et al., Science Oct. 30, 1998, vol. 282, 897–901, Carbon structure with three–dimensional periodicity at optical wavelengths.

J.E.G. Wijnhoven et al, Science, Aug. 7, 1998, vol. 281, 802–804, Preparation of photonic crystals made of air spheres in titania.

M. Trau et al., Science, May 3, 1996, vol. 272, 706–709, Field–induced layering of colloidal crystals.

H. Miguez et al., Adv. Mat., 1998, vol. 10, 480, Control of the photonic crystal properties of fcc–packed submicrometer $SiO_2$ spheres by sintering, no month.

N.D. Denkov et al., Nature, 1993, vol 361, 121, Two–dimensional crystallization, no month.

Rogach et al., Chem. Mater, Aug. 25, 2000, vol. 12, 2721–2726, Electrophoretic deposition of latex–based 3D colloidal photonic crystals: A technique for rapid production of high–quality opals.

(List continued on next page.)

*Primary Examiner*—Robert R. Koehler
(74) *Attorney, Agent, or Firm*—Lynn C. Schumacher; Hill & Schumacher

(57) ABSTRACT

Method of synthesis of confined colloidal crystals using electrodeposition. The present invention provides a method of growing confined colloidal crystal structures using electrodeposition of monodispersed charged colloid spheres onto a substrate patterned with an array of electroconductive surface relief features on a surface of a substrate. In this approach, control over large-scale ordering is achieved via a planar pattern whose scale is on the order of tens of microns, a regime readily accessed through coarse lithography, laser micromachining, and holography.

31 Claims, 4 Drawing Sheets

OTHER PUBLICATIONS

M. Holdage et al., Langmuir, Jun. 31, 1999, vol. 15, 4701–4704, Electrophoretic deposition to control artificial opal growth.

R. C. Hayward et al., Nature, Mar. 2, 2000, vol. 404, 56–59, Electrophoretic assembly of colloidal crystals with optically tunable micropatterns.

O. Vickreva et al., Adv. Mater, 2000, vol. 2, 110–112, Colloid crystal growth under oscillatory shear, no month.

P. Jiang et al., Chem Mater, Jul. 15, 1999, vol. 11, 2132–2140, Single–crystal colloidal multilayers of controlled thickness.

B. Gates et al., Adv. Mater, 1999, vol. 11, 466–469 Assembly of nanoparticles into opaline structures over large areas, no month.

K–hui Lin et al., Phys. Rev. Lett., Aug. 21, 2000, vol. 85, No. 8, 1770–1773, Entropically driven colloidal crystallization on patterned surfaces.

P. Yang et al., Adv. Mater, 2001, vol. 13, 427–431, Patterning porous oxides within microchannel networks, no month.

G. Z. Ozin, et al., Adv. Mater, Apr. 2, 2001, vol. 11, 95–104, The race for the photonic chip: Colloidal crystal assembly in silicon wafers.

P. Kwizera et al., Appl. Phys. Lett. 41(4), Aug. 15, 1982, pp. 379–381, "Solid phase epitaxial recrystallization of thin polysilicon films amorphized by silicon ion implantation".

Enoch Kim et al., Advanced Materials, 1996, 8, No. 3, pp. 245–247, "Two– and Three–Dimensional Crystallization of Polymeric Microspheres by Micromolding in capillaries", no month.

H.W. Deckman et al., Appl. Phys. Lett. 41(4), Aug. 15, 1982, pp. 377–379, "Natural lithography".

(a) (b) (c)

METHOD OF COLLOID CRYSTAL GROWTH ON PATTERNED SURFACES

FIELD OF THE INVENTION

The present invention relates to a method of growing confined colloidal crystals, and more particularly the present invention relates to a method of electrodeposition of colloidal crystals on electroconductive surface relief patterns on a substrate.

BACKGROUND OF THE INVENTION

Photonic crystals exhibit interesting physical phenomena (S. John, Phys. Rev. Lett. 1987, 58, 2486) and enable novel optical devices (H. Kosaka et al., Appl. Phys. Lett. 1999, 74, 1370). The realization of photonic crystals based on ordering of monodispersed colloid spheres followed by infiltration of high-refractive index materials possesses the appealing feature that large photonic crystals may be realized without recourse to top-down nanolithographic patterning (A. Imhof, D. J. Pine, Nature 1997, 389, 948; B. T. Holland, C. F. Blanford, A. Stein, Science 1998, 281, 538; A. A. Zahidov et al. Science 1998, 282, 897; J. E. G. Wijnhoven, W. L. Vos, Science 1998, 281, 802). However, existing approaches for organizing colloid particles in ordered structures, provide no reproducible means of controlling the size and the density of defects which make up the resulting polycrystal, see M. Trau, D. A. Saville, I. A. Aksay, Science 1996, 272, 706; H. Miguez et al., Adv. Mat. 1998, 10, 480; K. E Davis, W. B. Russel, W. J. Glantschnig, J. Chem. Soc. Faraday Trans. 1991, 87, 411; H. W. Deckman, J. H. Dunsmuir, Appl. Phys. Lett. 1982, 41, 377; N. D. Denkov et al, Nature 1993, 361, 26; Rogach, A. L., Kotov, N. A.; Koktysh, D. S.; Ostrander, J. W.; Ragoisha, G. A. Chem. Mater. 2000, 12, 2721; M. Holdago et al. Langmuir 1999, 15, 4701; R. C. Hayward, D. A. Saville, I. A. Aksay, Nature 2000, 404, 56; O. Vickreva, O. Kalinina, E. Kumacheva, Adv. Mater. 2000, 2, 110; P. Jiang, J. F. Bertone, K. S. Hwang, V. L. Colvin, Chem. Mater. 1999, 11, 132. This militates against control over the establishment of delocalized Bloch waves inside the structures, just as amorphousness and polycrystallinity in electronic semiconductors impede the formation of sharply-defined electronic bandgaps, electron wave coherence, and high-mobility electron transport. The reproducible realization of highly perfected single crystals is thus of critical importance in the practical exploitation of novel photonic crystal phenomena.

Recently, several experimental studies have demonstrated that confinement can significantly enhance colloid crystal growth and ultimately produce single-crystal or close-to-single crystal structure, see E. Kim, Y. Jia, G. M. Whitesides, Adv. Mater. 1996, 8, 245; B. Gates, D. Qin, Y. Xia. Adv. Mater. 1999, 11, 466; K-hui Lin et al., Phys. Rev. Lett. 2000, 85, 1770; P. Yang et al. Adv. Mater. 2001, 13, 427; G. A. Ozin, S. M. Yang, Adv. Mater. 2001, 11, 95.

It is particularly advantageous to provide a method for growing confined colloidal crystals which may be precursors or building blocks of photonic circuits.

SUMMARY OF THE INVENTION

It is an object of the present invention to provide a method of growing confined colloidal crystals by electrodeposition of colloidal particles into electrically conductive surface relief patterns on a substrate.

The present invention shows how a transition from a disordered state to a strongly ordered state occurs in two-dimensional arrays of colloid microspheres, following their confinement to progressively thinner gaps. The confinement induces disorder-order transition at a well-defined width of the gap, reminiscent of confinement-induced liquid-to-solid transition in simple liquids previously reported.

The present invention provides a method for producing colloidal crystals on patterned surfaces, comprising the steps of:

a) producing a pre-selected relief pattern of topographical features in a surface of a substrate in which selected topographical features into which colloidal particles are to be deposited include an electrically conductive layer; and b) electrodepositing colloidal particles of pre-selected size and shape into said selected topographical features on said surface of the substrate.

The present invention provides a product comprising a colloidal crystal confined to a surface of a substrate produced by a method comprising the steps of:

a) producing a pre-selected relief pattern of topographical features in a surface of a substrate in which selected topographical features into which colloidal particles are to be deposited include an electrically conductive layer; and b) electrodepositing colloidal particles of pre-selected size and shape into said selected topographical features on said surface of the substrate.

The present invention also provides a method for producing colloidal crystals on a surface of a substrate, comprising the steps of:

a) patterning an electrically conducting surface of a substrate with a pre-selected pattern of relief features; and b) electrodepositing colloidal particles of pre-selected size and shape into said relief features in said electrically conducting surface.

The present invention also provides a product comprising a colloidal crystal confined to a surface of a substrate produced by a method comprising the steps of:

a) patterning an electrically conducting surface of a substrate with a pre-selected pattern of relief features; and b) electrodepositing colloidal particles of pre-selected size and shape into said relief pattern in said electrically conducting surface.

This invention also provides a method for producing colloidal crystals on patterned surfaces, comprising the steps of:

a) modulating in a controllable manner the spatial profile of electrical conductivity of a surface of a substrate so that a selected portion of the surface defining a surface pattern is electrically conductive, and at the same time, modulating in a controllable manner a relief profile of this same surface to produce a surface relief profile including confined surface features having electrically conductive coatings into which colloidal particles can be electrodeposited; and b) electrodepositing colloidal particles into said electrically coated surface features.

BRIEF DESCRIPTION OF THE DRAWINGS

The method of synthesis of confined colloidal crystals according to the present invention will now be described, by way of example only, reference being made to the accompanying drawings, in which.

DETAILED DESCRIPTION OF THE INVENTION

The present invention provides a method of growing confined colloidal crystal structures using electrodeposition of preferably monodispersed charged colloidal spheres onto a substrate patterned with an array of electroconductive grooves whose progressively diminishing width was commensurate or incommensurate with the dimensions of a discrete number of colloid spheres. In this approach, control over large-scale ordering does not rely on a submicron-scale surface template (such as disclosed in A. V. Blaaderen, R. Ruel, P. Wiltzius, Nature 1997, 385, 321) but is achieved via a surface relief pattern comprised of topographical features whose scale was on the order of tens of microns, a regime readily accessed through coarse lithography, laser micromachining, and holography.

The present invention will now be illustrated using the following non-limiting example.

EXAMPLE

The process disclosed herein is exemplified using latex spheres of poly (methyl methacrylate) (PMMA) prepared by surfactant-free emulsion polymerization. The diameter of particles was 0.58 µm, polydispersity index 1.03, and $\xi$-potential –54.9 mV at pH 5.46. However those skilled in the art will appreciate that the present method is not restricted to spherical polymeric colloidal particles but is applicable to a broad range of colloidal materials of different geometries and composition.

Figure 1A:
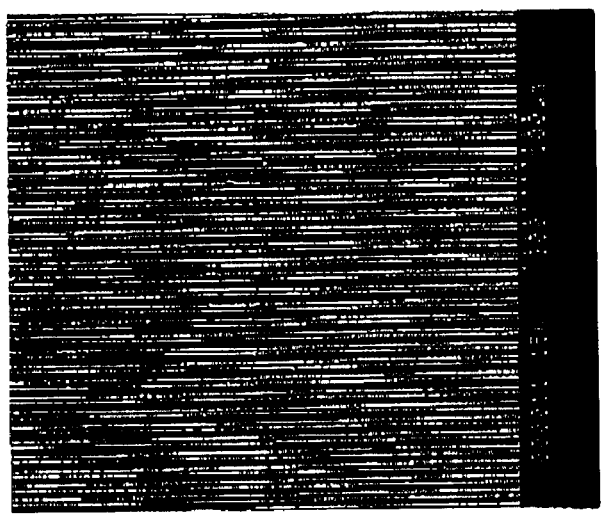
FIG. 1(a) shows an SEM image of the patterned ITO surface in which the scale bar is 100 μm.
Figure 1B:
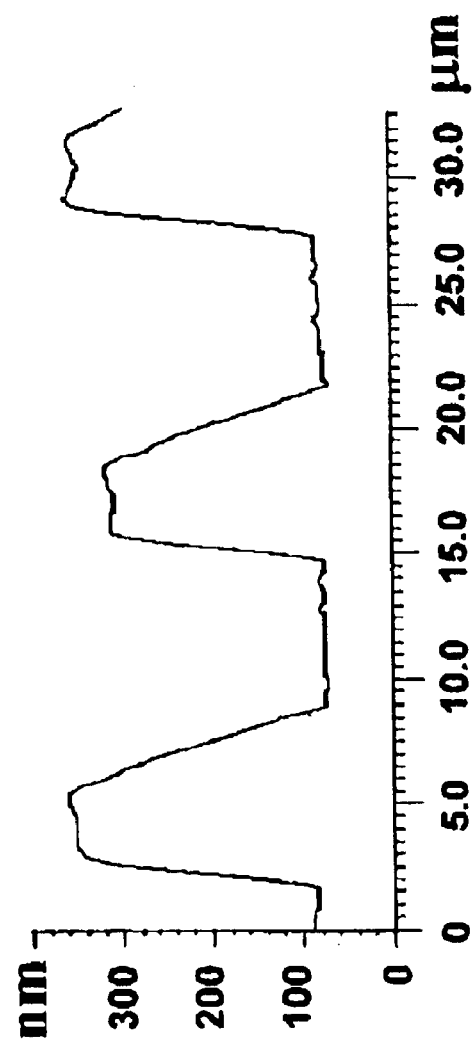
FIG. 1(b) shows a typical atomic force microscopy (AFM) profile of the patterned indium tin oxide (ITO) surface with the height of the isolating walls being ca. 300 nm.

The surface patterning was realized by writing holographic gratings in thin negative photoresist layers (Shipley Microposit S1805), spin-coated on ITO glass slides, using a helium-cadmium laser (35 mW beam at 442 nm). Exposure of the photoresist to light accompanied by polymer development produced a pattern of periodically alternating isolating ribs and conductive grooves on the surface of ITO-covered slides (FIG. 1(a)). The width of the grooves, D, was varied from ca. 0.6 to 50 µm by changing the angle between the two interfering beams and the exposure time from 5 to 45 s. The height of the ribs was ca. 0.3 µm; smaller and larger heights were achievable through dilution of photoresist solution and by using other photoresists (e.g., Shipley Microposit S1827), respectively. A typical topographic profile of the patterned surface is shown FIG. 1(b). The bottom of the conductive groove had a root mean square (rms) roughness not exceeding several nanometers, similar to the roughness of the surface of the uncoated ITO slides.

Figure 1C:
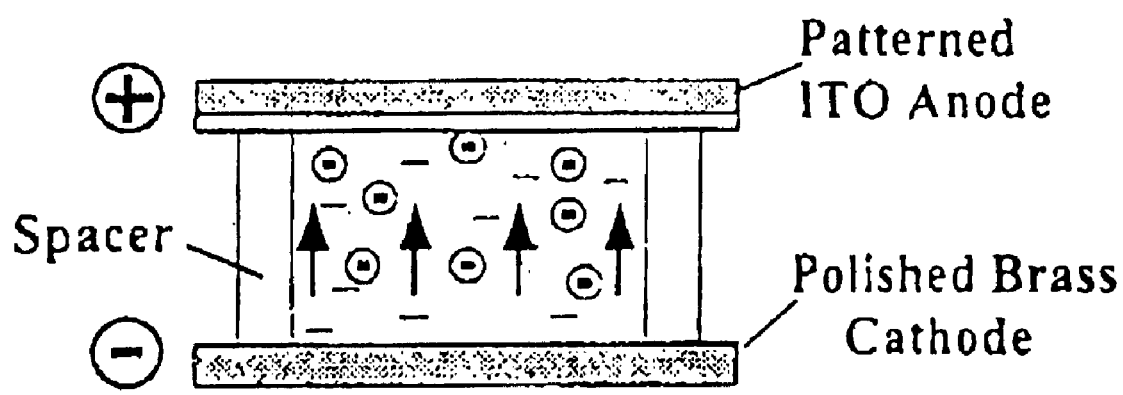
FIG. 1(c) shows a schematic drawing of the electrochemical cell setup used for anodic electrodeposition of the negatively charged PMMA particles in which the electrodes are separated by a 5 mm spacer.

A schematic drawing of the electrodeposition cell is shown in FIG. 1(c). To avoid any effects associated with sedimentation of particles, electrophoresis preferably is carried out against gravity. The conductive surface of the substrate forms one electrode located above the counterelectrode at the bottom of the cell. The colloidal dispersion includes constituents which confer either a positive or negative charge on the colloidal particles so if the colloidal particles are positively charged the conducting patterned surface has a negative electrical potential applied thereto and a positive charge is applied to the counterelectrode. Similarly, if the colloidal particles are negatively charged (such as is the case shown in FIG. 1(c) then the upper electrode is positively charged having a positive electrical potential applied thereto.

Dispersions may be prepared using emulsion, dispersion, suspension polymerization if particles are polymeric, or if particles are inorganic (e,g,. silica particles) the dispersion may be prepared using sol-gel processes.

For polymeric particles typical constituents of the solution are monomer(s), initiator, stabilizer, chain-transferring agent, deionized water or other solvents. The charge can be negative, if anionic initiators and monomers are used, or positive (if cationic initiator and monomers are used. For inorganic particles (e.g. silica particles) the constituents of the dispersion may be for example tetraethyl orthosilicate, ammonia, water, and alcohols.

The speed of deposition, v, on the patterned anode was determined by the relation between the force imposed on particles by electric field and gravitational, Archimedes, and frictional forces as $v=\{uE-[d^2(\rho_p-\rho_w)g]\}/18\eta$, where u is the electrophoretic mobility, d is the diameter of particles, $\rho_p$ and $\rho_w$ are the densities of PMMA spheres and water, respectively, g is gravity acceleration, and $\eta$ is the viscosity of the dispersion medium. The density of microsphere packing on the electrode and number of deposited layers were controlled by varying the time of deposition and the electric field strength. In a typical experiment, an electric field of 400 V/cm was applied for 90 seconds to the electrodes confining a 0.25 wt % dispersion of PMMA particles in a 50/50 mixture of ethanol and de-ionized water. Following electrodeposition, the samples were rinsed in deionized water and dried.

Figure 2:
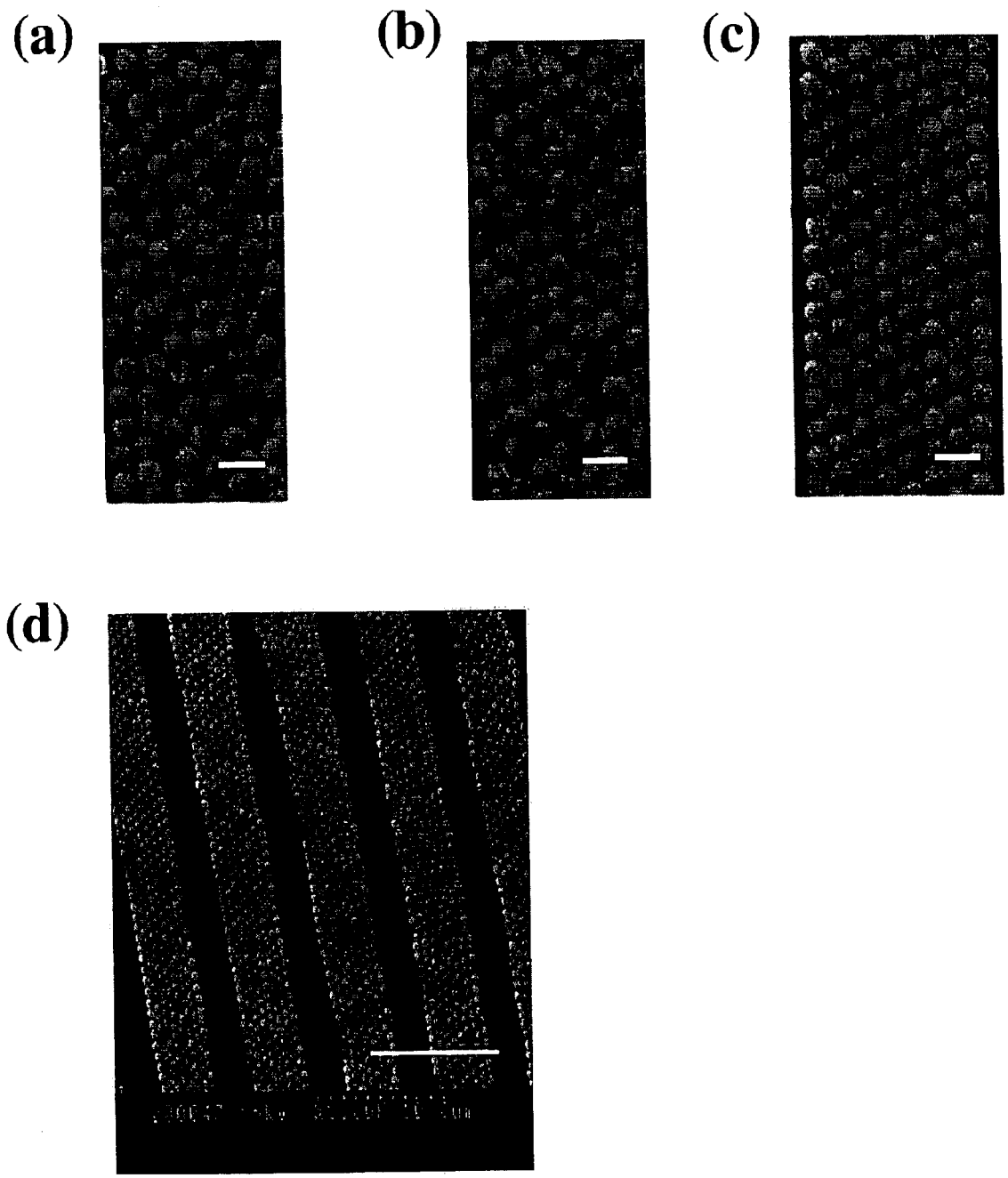
FIGS. 2(a), 2(b), 2(c) and 2(d) show scanning electron microscopy (SEM) images of the colloid arrays electrodeposited on non-patterned (FIG. 2(a)) and patterned (2b–2d) ITO surface in which the widths of the grooves are 5.5 µm in FIG. 2(b) and 4.5 µm in FIGS. 2(c) and 2(d), the SEM images of the colloid arrays with the width 4.5 µm were cropped in FIGS. 2(a) and 2(c), the scale bar is 1 µm FIGS. 2(a) and 2(b) and 10 µm in FIG. 2(d)

FIGS. 2(a)–2(c) show typical SEM images of the 2D microsphere arrays deposited on the non-patterned and patterned surfaces. No noticeable difference was observed in the structure of 2D colloid arrays electrodeposited on non-patterned ITO surfaces and on the substrates patterned with conductive grooves whose width exceeded ca. 7.5 µm. The structure of the colloid arrays was essentially disordered with occasional ordered domains not exceeding 20 µm² (FIG. 2(a)). Electrodeposition on the substrates patterned with grooves whose width was 6.0±1.5 µm resulted in particle layering parallel to the rib walls, as is shown in FIG. 2(c). A dramatic enhancement in microsphere organization in two-dimensional hexagonal close-packed arrays was observed for D<4.5 µm, as is demonstrated in FIG. 2(c). The enhancing effect of confinement on colloid crystal growth was observed for the particles deposited into the grooves with the height of at least 0.3 µm and the width varying from 0.6 to 4.5 µm; the latter grooves confined nine layers of microspheres aligned parallel to the isolating ribs. Dilution of the photoresist solution resulted in shallow grooves whose depth was not sufficient for enhanced ordering.

At the beginning of the electrodeposition process, the structure of the colloidal arrays in the grooves was essentially random, however, as more particles reached the electrode, microsphere reorganization in the grooves occurred by squeezing the newly arriving spheres between the already deposited particles and the synergistic particle rearrangement. This resulted in large-scale particle ordering, as is shown in FIG. 2(d) for assembly of the colloid spheres in 4.5 µm-thick grooves.

Organization of particles in the grooves was governed by two processes: electrodeposition driven by particle coulombic interactions with the electrode surface and in the later stage by capillary and electrohydrodynamic forces as disclosed in M. Trau, D. A. Saville, I. A. Aksay, Science 1996, 272, 706. In addition to Coulombic attraction, particle binding to the electrode was enhanced by the reaction of ionized surface carboxylic groups with H+-ions produced by electrolysis of water on the anode. The latter mechanism led to adhesion of the particles to each other. When colloid arrays were obtained by casting latex dispersion on the patterned substrate, the sediment was easily removed from the surface by rinsing with water.

The role of electric field was dominant: in the control experiment casting of the PMMA dispersion on the patterned surfaces led to a very moderate ordering of the microspheres in the grooves with the area of ordered domains not exceeding ca. 30 microns.

Figure 3:
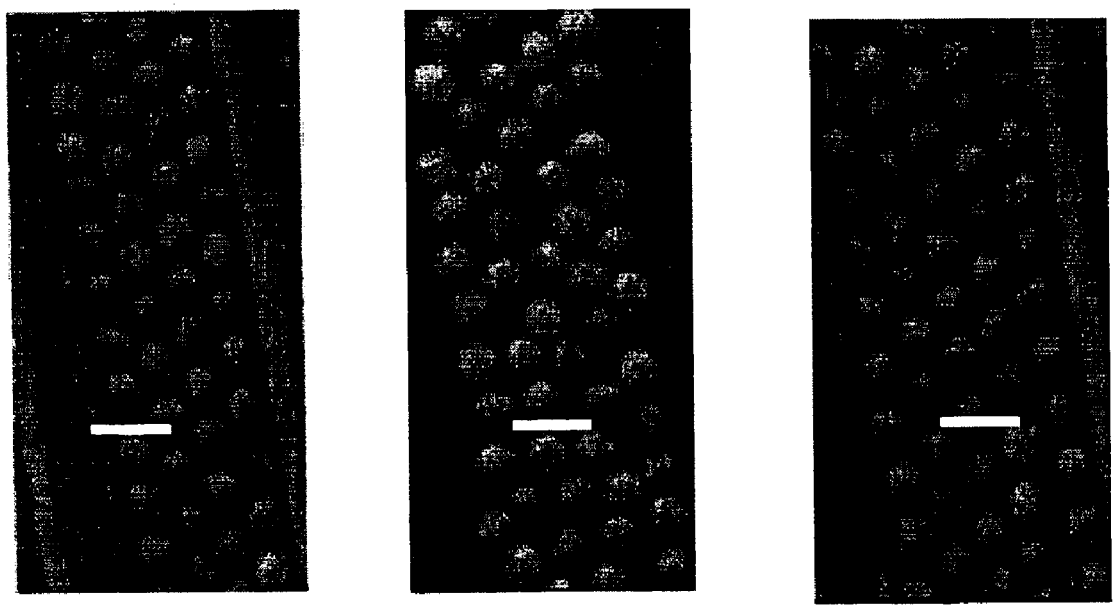
FIGS. 3(a), 3(b) and 3(c) shows the effect of confinement on organization of colloid particles in three conductive grooves of different widths showing order-disorder-order transition in colloid arrays following progressive confinement of the colloid array, the widths of the grooves are 2.22 µm in FIG. 3(a), 2.51 µm in FIG. 3(b) and 2.72 µm in FIG. 3(c)
FIG. 3(d) shows the planar packing density profile $\phi=f(D)$ for the 2D array of colloid microspheres with the dashed line showing theoretical planar density of 0.9069 for close-packed 2D hexagonal lattice.
Figure 3:
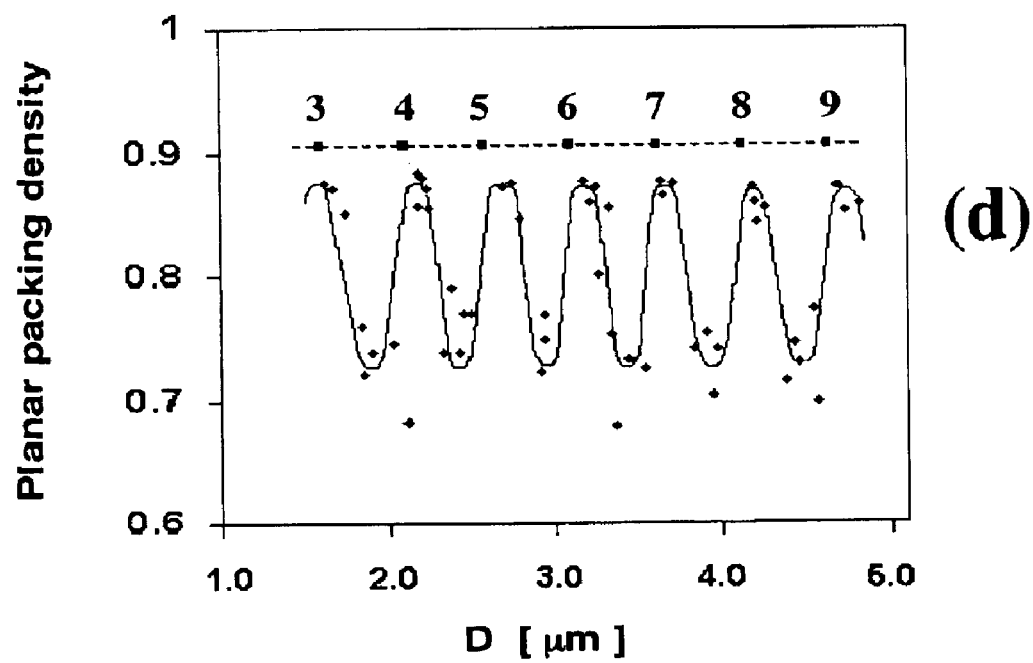

A close inspection of particle arrays in the grooves with D<4.5 µm revealed that microsphere organization was represented by two states: highly ordered hexagonal packing and random dense packing. As an example, FIG. 3(a), from left to right, shows the SEM images of an order-disorder-order transition in particle arrays when D changed as 2.22→2.51→2.72 µm, respectively. A quantitative measure of this effect was obtained by determining the planar packing density, $\phi$ for the 2D arrays of particles in the grooves as a function of the groove width (see R. M. German, Sintering Theory and Practice. New York: Wiley, 1996). FIG. 3(d) shows the planar packing density profile $\phi$=f(D) for the 2D array of colloid microspheres with the dashed line showing theoretical planar density of 0.9069 for close-packed 2D hexagonal lattice. In FIG. 3(d) the graph $\phi$=f(D) shows oscillations with the periodicity 0.052±0.02 µm. Each maximum in $\phi$ of ca. 0.87±0.02 corresponded to the high density hexagonal structure of the particle arrays containing a discrete number of layers aligned parallel to the wall. The values of $\phi$ for wells varied from ca. 0.67 to 0.81. Occasionally, square planar packing was observed with $\phi$=0.78.

The maxima on the oscillating profile in FIG. 2(b) were close to the 2D fractional density of 0.907 theoretically predicted for the six-fold geometry, see R. M. German. Sintering Theory and Practice, New York: Wiley, 1996. The theoretical width of the grooves, $D_c$, accommodating a discrete number of in-plane close-packed hexagonal particle layers were calculated as $D_c=2R[(n-1)\cos 30°+1]$, where R is the radius of spheres and n is the number of layers of particles aligned parallel to the wall. The values of $D_c$ were 5±3% smaller than the experimental values of groove widths providing strong microsphere ordering, a discrepancy presumably caused by a larger effective particle size due to electrostatic repulsion between the spheres. In contrast to this tolerable incommensurability, the defect disordered structure appeared from a strong mismatch between $D_o$ and D exceeding 10–30%. Similarly, no ordered structures could be obtained when particle polydispersity exceeded 1.08±0.02. Confinement-induced ordering and oscillatory profile of particle planar packing density bear a striking resemblance to confinement-induced layering and solidification in thin layers of simple fluids with quasi-spherical molecules, in which (a) crystallization occurred when the width of the gap between the two confining walls became comparable with several molecular diameters and (b) upon progressive thinning of the gap liquification of the solid-like lattice took place every time when the thickness of the layer was not commensurate to the discrete number of the confined molecules (J. N. Israelachvili, P. M. McGuiggan, A. M. Homola, Science 1988, 240, 289; J. Van Alsten, S. Granick, Phys. Rev. Lett. 1988, 61, 2570; H. Yoshizawa, J. N. Israelachvili, J. Chem. Phys. 1993, 75, 140; J. Klein, E. Kumacheva, Science 1995, 269, 816; M. Schoen, D. J. Diestler, J. Cushman, J. Chem. Phys. 1987, 87, 5464; P. A. Thompson, M. O. Robbins, Science 1990, 250, 792; J. Gao, W. D.Luedtke, U. Landman, U. Phys. Rev. Lett. 1997, 79, 705; S. T. Cui, P. T. Cummings, H. D. Cochran. J. Chem. Phys. 2001, 114, 7189).

Multilayer colloid crystal growth was achieved in a galvanostatic regime by increasing the time of electrodeposition from 90 s to ca. 2 min. In these experiments, the height of the rib of ca. 0.3 µm was insufficient in producing ordered arrays thicker than two particle layers. To provide out-of-plane ordering in up to five layers arrays 2 µm high grooves were efficient.

The present method has two important implications. First, it gives a new, very useful avenue for controlled growth of large-scale colloidal crystals. The speed of colloid crystal growth can be controlled via electrodeposition parameters such as voltage (electric field strength) and electrophoretic mobility of the particles, thus control over layer-by-layer deposition is provided. This feature makes it possible to examine defects emerging in the layers adjacent to the substrate. Moreover, in the second step electrodeposition of high-refractive index II–VI semiconductors in the interstitial spaces between the colloid spheres can be used for templating photonic crystals, see for example P. V. Braun, P. Wiltzius, Nature 1999, 402, 603. Precise control of the degree of confinement is achieved by holographic patterning through the variation of widths of the groves and heights of the ribs.

The method for producing colloidal crystals includes controlling the density of packing of the colloidal particles by varying the time of deposition and electric field strength which is achieved by controlling the potentials on the two electrodes and the duration of time the electric field is applied.

While the example above used an ITO spin coated glass slide as the substrate with a conductive surface in which the surface relief pattern is written, it will be appreciated that any substrate may be used including any glass with a conductive layer, semiconductors, photoconductors, dielectrics, metals and insulators so long as the surface includes a conductive component.

Similarly the method is not restricted to monodisperse spherical PMMA particles so that any colloidal particle may be deposited using this method. The example above employed a surface relief pattern of parallel grooves written into the conductive ITO layer. It will be understood that any relief pattern may be used including relief features which have pre-selected dimensions of width, length and depth. The relief features may include any one of single or multiple elongate grooves of pre-selected dimensions of width, length and depth, single or multiple indentations of pre-selected dimensions of width, length and depth. The relief pattern will be determined by the end application of the optical device being constructed. Thus an optical chip may be produced requiring a surface relief pattern comprised of a combination of linear grooves, isolated indentations or indentations connected by grooves just to mention a few possibilities.

The surface relief features making up the pattern may have dimensions of length, depth and width specifically tailored to receive a desired number of colloidal particles along the length, width and through the depth of the features. Preferably the colloidal particles are substantially monodisperse spherical particles having a diameter in a range from 20 nm to 10 microns. However there is no optimum size range per se but rather the particle sizes will depend on the final application for the device, as far as the particles are monodisperse and the relationship between the spherical colloidal particle diameter 2R and the width $D_c$ of the relief feature holds: $D_c=2R\,[(n-1)\cos 30°+1]$ where n is the number of layers of particles aligned parallel to the wall.

The method of the present invention relies upon electrodeposition of charged colloidal particles into a surface relief pattern. It will be understood that the electrically conductive component on the surface relief pattern may be obtained by several methods. In the Example above exemplifying this invention the electrically conductive relief pattern is produced by writing the pattern into a thin negative photoresist layer which is spin coated onto the conductive ITO layer but the invention is not limited to this method of obtaining a conductive surface relief pattern. For example, a pre-selected surface relief pattern may be produced in the surface of the substrate first and then it may be partially coated with an electrically conductive coating covering only that part of the surface onto which the colloidal crystal is to be grown.

Thus the method broadly involves producing a pre-selected relief pattern of topographical features in a surface of a substrate with those selected topographical features into which colloidal particles are to be deposited including an electrically conductive layer and then electrodepositing colloidal particles of pre-selected size and shape into the selected topographical features on the surface of the substrate. The substrate may initially have an electrically conducting surface on which the relief pattern is produced resulting in part of the surface into which colloidal particles are to be electrodeposited being electrically conductive and the rest of the surface covered by an insulated or otherwise blocking layer. Alternatively the surface of the substrate may be patterned and then selected parts of the patterned surface may have an electrically conductive coating applied thereto after which the colloidal particles are electrodeposited into the electrically conductive portion of the surface to form the colloidal crystal.

As used herein, the terms "comprises", "comprising", "including" and "includes" are to be construed as being inclusive and open ended, and not exclusive. Specifically, when used in this specification including claims, the terms "comprises", "comprising", "including" and "includes" and variations thereof mean the specified features, steps or components are included. These terms are not to be interpreted to exclude the presence of other features, steps or components.

The foregoing description of the preferred embodiments of the invention has been presented to illustrate the principles of the invention and not to limit the invention to the particular embodiment illustrated. It is intended that the scope of the invention be defined by all of the embodiments encompassed within the following claims and their equivalents.

Therefore what is claimed is:

1. A method for producing colloidal crystals on patterned surfaces, comprising the steps of:
   a) producing a pre-selected relief pattern of topographical features in a surface of a substrate in which selected topographical features into which colloidal particles are to be deposited include an electrically conductive layer; and
   b) electrodepositing colloidal particles of pre-selected size and shape into said selected topographical features on said surface of the substrate.

2. The method for producing colloidal crystals according to claim 1 wherein the substrate includes an electrically conductive surface on which said relief pattern is produced.

3. The method for producing colloidal crystals according to claim 1 wherein the relief pattern of topographical features is produced in a surface of a substrate, and wherein thereafter an electrically conductive coating is applied to the pre-selected topographical features.

4. The method for producing colloidal crystals according to claim 1 wherein the step of electrodepositing colloidal particles of pre-selected size and shape includes forming a colloidal dispersion of the colloidal particles in which the colloidal particles acquire an electric charge, forming an electrodeoposition cell including the colloidal dispersion and two electrodes with one of said two electrodes being defined by the electrically conducting layer in the selected surface relief features on the surface of the substrate, and the other of said two electrodes being a counterelectrode spaced from said electrically conducting surface of the substrate, applying an electrical potential to said electrically conducting surface of the substrate of opposite polarity to the electric charge on the colloidal particles and applying an electrical potential to said counterelectrode of opposite polarity applied to the electrically conducting surface of the substrate.

5. The method for producing colloidal crystals according to claim 1 wherein the colloidal particles are substantially monodisperse spherical particles having a diameter in a range from about from 15 nm to about 10 microns.

6. The method for producing colloidal crystals according to claim 4 wherein the electrodeoposition cell is oriented so that the electrode defined by the electrically conducting surface of the substrate is positioned above the counterelectrode so that electrodeposition into the relief pattern occurs against gravity.

7. The method for producing colloidal crystals according to claim 1 including controlling a density of packing of said colloidal particles by varying a time of deposition and electric field strength by controlling the potentials on the two electrodes and the duration of time the electric field is applied.

8. The method for producing colloidal crystals according to claim 5 wherein the relief features have pre-selected dimensions of width, length and depth.

9. The method for producing colloidal crystals according to claim 1 wherein the relief features include any one of single or multiple elongate grooves of pre-selected dimensions of width, length and depth, single or multiple indentations of pre-selected dimensions of width, length and depth.

10. The method for producing colloidal crystals according to claim 9 wherein the pre-selected dimensions of width, length and depth of said relief features are selected to receive therein a pre-selected discrete number of colloidal particles.

11. The method for producing colloidal crystals according to claim 5 wherein said spherical colloidal particles are made of poly(methylmethacrylate).

12. The method for producing colloidal crystals according to claim 10 wherein said the pre-selected dimensions of width and depth are in a range from about 20 nm to about 80 microns for both width and the height.

13. The method for producing colloidal crystals according to claim 10 wherein the step of patterning an electrically conducting surface of a substrate with a pre-selected pattern of relief features includes writing topographical features in thin negative photoresist layers coated on an electronically conducting layer on the substrate surface.

14. The method for producing colloidal crystals according to claim 10 wherein said substrate is a selected from the group consisting of glasses, semiconductors, photoconductors, dielectrics, metals and insulators.

15. The method for producing colloidal crystals according to claim 10 wherein the substrate is a glass, and wherein the electrically conducting layer on a surface of the glass substrate is an indium tin oxide (ITO) coating.

16. The method for producing colloidal crystals according to claim 4 wherein said colloidal dispersion include constituents which confer a positive charge on said colloidal particles.

17. The method for producing colloidal crystals according to claim 4 wherein said colloidal dispersion include constituents which confer a negative charge on said colloidal particles.

18. The method for producing colloidal crystals according to claim 1 wherein the colloidal particles are substantially monodisperse spherical particles having a diameter and a relationship between the spherical colloidal particle diameter $2R$ and a width $D_c$ of the relief feature holds in which $D_c=2R[(n-1)\cos 30°+1]$ where n is the number of layers of particles aligned parallel to a wall of the relief feature in which the spherical colloidal particles are grown.

19. A product comprising a colloidal crystal confined to a surface of a substrate produced by a method comprising the steps of:
 a) producing a pre-selected relief pattern of topographical features in a surface of a substrate in which selected topographical features into which colloidal particles are to be deposited include an electrically conductive layer; and
 b) electrodepositing colloidal particles of pre-selected size and shape into said selected topographical features on said surface of the substrate.

20. The product according to claim 19 wherein the colloidal particles are substantially monodisperse spherical particles having a diameter in a range from about 15 nm to about 10 microns.

21. The product according to claim 19 wherein the relief features include any one of single or multiple elongate grooves of pre-selected dimensions of width, length and depth, single or multiple indentations of pre-selected dimensions of width, length and depth.

22. The product according to claim 21 wherein the pre-selected dimensions of width, length and depth of said relief features are selected to receive therein a pre-selected discrete number of colloidal particles.

23. The product according to claim 19 wherein said substrate is a selected from the group consisting of glasses, semiconductors, photoconductors, dielectrics, metals and insulators.

24. The product according to claim 19 wherein step a) includes writing topographical features in thin negative photoresist layers coated on an electronically conducting layer on the substrate surface.

25. A method for producing colloidal crystals on a surface of a substrate, comprising the steps of:
 a) patterning an electrically conducting surface of a substrate with a pre-selected pattern of relief features; and
 b) electrodepositing colloidal particles of pre-selected size and shape into said relief features in said electrically conducting surface.

26. A product comprising a colloidal crystal confined to a surface of a substrate produced by a method comprising the steps of:
 a) patterning an electrically conducting surface of a substrate with a pre-selected pattern of relief features; and
 b) electrodepositing colloidal particles of pre-selected size and shape into said relief pattern in said electrically conducting surface.

27. A method for producing colloidal crystals on patterned surfaces, comprising the steps of:
 a) modulating in a controllable manner the spatial profile of electrical conductivity of a surface of a substrate so that a selected portion of the surface defining a surface pattern is electrically conductive, and at the same time, modulating in a controllable manner a relief profile of this same surface to produce a surface relief profile including confined surface features having electrically conductive coatings into which colloidal particles can be electrodeposited; and
 b) electrodepositing colloidal particles into said electrically coated surface features.

28. The method according to claim 27 wherein said substrate is a selected from the group consisting of glasses, semiconductors, photoconductors, dielectrics, metals and insulators.

29. The method according to claim 27 wherein the substrate is a glass, and wherein the electrically conducting coating on a surface of the glass substrate is an indium tin oxide (ITO) coating.

30. The method according to claim 27 wherein the colloidal particles are substantially monodisperse spherical particles having a diameter in a range from about from 15 nm to about 10 microns.

31. The method for producing colloidal crystals according to claim 27 wherein the colloidal particles are substantially monodisperse spherical particles having a diameter and a relationship between the spherical colloidal particle diameter $2R$ and a width $D_c$ of the relief feature holds in which $D_c=2R[(n-1)\cos 30°+1]$ where n is the number of layers of particles aligned parallel to a wall of the relief feature in which the spherical colloidal particles are grown.

\* \* \* \* \*